United States Patent [19]

Cortellino

[11] 4,078,098

[45] Mar. 7, 1978

[54] HIGH ENERGY RADIATION EXPOSED POSITIVE RESIST MASK PROCESS

[75] Inventor: Charles A. Cortellino, Wappingers Falls, N.Y.

[73] Assignee: International Business Machines Corporation, Armonk, N.Y.

[21] Appl. No.: 473,603

[22] Filed: May 28, 1974

[51] Int. Cl.$^2$ ............................................. B05D 3/06
[52] U.S. Cl. ...................................... 427/43; 96/35.1; 96/36.2; 96/48 R; 427/273
[58] Field of Search .................. 117/93.31, 8; 96/35.1, 96/36.2, 48 R, 115 R, 115 P

[56] References Cited

U.S. PATENT DOCUMENTS

| 2,892,712 | 6/1959 | Plambeck | 96/48 R |
| 3,535,137 | 10/1970 | Haller et al. | 117/93.31 |
| 3,770,433 | 11/1973 | Bartelt et al. | 96/36.2 |
| 3,779,806 | 12/1973 | Gipstein et al. | 117/93.31 |

*Primary Examiner*—John H. Newsome
*Attorney, Agent, or Firm*—David M. Bunnell

[57] ABSTRACT

The development of high energy radiation exposed positive acrylate polymer resist layers by organic liquid developers, such as methyl isobutyl ketone, is improved by adding water to the ketone.

3 Claims, No Drawings

HIGH ENERGY RADIATION EXPOSED POSITIVE RESIST MASK PROCESS

BACKGROUND OF THE INVENTION

This invention relates generally to the formation of positive resist masks using high energy radiation and more particularly to the solvent development of electron irradiated acrylate polymer resist layers.

The formation of positive resist masks from layers of radiation degradable polymers is described, for example, by Haller and Hatzakis in U.S. Pat. No. 3,535,137. A radiation degradable polymer layer is coated on a substrate and is subjected to patternwise exposure by high energy radiation such as, for example, x-rays, nuclear radiation, and electrons. The irradiated regions of the polymer suffer a decrease in molecular weight and therefore become more rapidly soluble. A developer is then used to preferentially remove the irradiated portions of the layer. The substrate is then subjected to an additive or substractive process such as metallization or etching with the remaining portions of the resist layer acting to protect the substrate.

Although it is possible to employ developers which attack only the radiation exposed portions of the resist layer and which leave the unexposed portions almost intact, it has been found that higher process speeds can be obtained if a solvent is employed which attacks both the exposed and unexposed portions of the resist layer but which attacks the exposed portion at a higher rate. In order to further speed up the resist mask formation process, developing techniques which speed the development of exposed portions of the resist particularly when using higher molecular weight materials are desirable.

BRIEF SUMMARY OF THE INVENTION

In accordance with this invention, the process for forming patterned resist masks in which a layer of acrylate polymer is coated on a substrate, exposed to radiation in a pattern-wise manner, and the exposed portions removed from the substrate using a liquid ketone developer which dissolves the exposed portions at a faster rate than the unexposed portions; is improved by adding water such that the content of the water is from about 0.5 to about 2.2% by volume.

DETAILED DESCRIPTION

The resist materials which are useful in forming resist masks with high energy radiation systems according to the process of the invention are acrylate polymers which are degraded at dosage levels which are the equivalent of about 1 microcoulomb per square centimeter. Such resist polymers include, for example, polymers derived from lower alkyl esters of methacrylic acid, such as methyl methacrylate, n-butylmethacrylate, and t-butylmethacrylate. The polymers generally can have a weight average molecular weight ranging from about 50,000 to 5,000,000.

The exposure of the resist layer is accomplished by high energy radiation such as x-ray, nuclear radiation, electron beam, and so forth. A preferred method of exposure is by employing a scanning electron beam having an energy of from about 3 to 50KV at exposure times to provide dosage levels of from about 3 to 30 microcoulombs per square centimeter.

The development of the exposed resist is accomplished by dissolving away the exposed portions of the layer to form a relief image on the substrate using a liquid ketone developer which preferentially dissolves the exposed portions and attacks the unexposed portions at a lower rate. At lower dosage levels, the development process can be time consuming, particularly when using higher molecular weight polymers. Surprisingly, I have found that adding water, which is not a solvent for the resist layer materials, to the ketone developer acts to increase the development rate. This is unexpected because the presence of non-solvent has heretofore been used to retard the action of the solvent in order to minimize attack on the unexposed portions of the layer such as is described, for example, in U.S. Pat. No. 3,535,137. The water content of the ketone is brought to a level of from about 0.5% by volume up to about 2.2% by volume. The upper limit is approximately the saturation point of methyl-isobutyl ketone. Amounts of about 1.0 to 1.2% by volume have been found to give optimum results with respect to developer speed while maintaining resist sensitivity. (The sensitivity $S/S_0$, measures the relative rate of attack by the developer on the exposed, $S$, and unexposed $S_0$, portions of the resist layer.) The water content can be adjusted by first analyzing for any existing moisture such as by Karl Fisher analysis and then adding the required additional water. It can also be adjusted in a satisfactory manner for most purposes by simply removing any existing traces of moisture in the developer (for example, Baker Reagent Grade methyl-isobutyl ketone is stated to contain about 0.1% water and used developer may pick up water due to contamination) by placing it over a dessicant such as calcium chloride overnight and then adding the required amount of by volume of water for the development process.

The invention is further illustrated by, but is not intended to be limited to the following examples wherein parts or parts by weight unless otherwise indicated.

EXAMPLE 1

Silicon wafers having a surface coating of $SiO_2$ having a thickness of approximately 5,000 angstroms were coated with a layer of polymethyl methacrylate having a weight average molecular weight of about 400,000 by spin coating from an 8% solution of resist in chlorobenzene to provide a layer thickness of about 7,000 angstroms. The resist thickness for each wafer was measured and the wafers were exposed to a scanning electron beam at an energy of 25KV to provide a dosage level of about 18 microcoulombs per square centimeter in a pattern of 100 microinch lines with 100 microinch spaces. Following the exposure, the wafers were developed in dry methyl isobutyl ketone, to which had been added about 1.2% by volume of water, at a development temperature of about 21° C. The development time necessary to completely remove the exposed portions of the resist layer was 17 minutes. The sensitivity ratio $S/S_0$ was determined to be about 3.2. Sensitivity ratios of 2 or above are generally considered to be satisfactory for most purposes.

EXAMPLE 2

In order to illustrate the effect of water content using acrylate polymers of different molecular weight in different exposure energies, silicon wafers having a surface coating of about 5,000 angstoms of thermal oxide were coated with resist thicknesses of about 7,000 angstroms as shown in Table I below. The unexposed film thicknesses were measured using a Tallystep and the resist layers were prebaked on a hotplate at 160° C for 30 minutes. The resist layers were exposed to a scanning electron beam at 25KV in a hundred microinch line and hundred microinch space pattern to energy levels of either about 20 microcoulombs per square centimeter or about 10 microcoulombs per square centimeter. The weight average molecular weight of the polymethyl methacrylate polymers was about 400,000 for polymer A and about 80,000 for polymer B. Three amounts of water in methyl isobutyl ketone were employed. The first was 0.1%, or the level of reagent grade solvent. The second was 1.1%. The third was 2.2% by volume or the approximate water saturation point of the methyl isobutyl ketone developer. The time to completely remove the exposed portions of the resist are recorded in Table I as are calculations for resist sensitivity.

TABLE I

| Resist | Original Thickness | $H_2O$ MIBK | Development Time into 100u''; min. | | Development Rates & Ratios | | | | | |
|---|---|---|---|---|---|---|---|---|---|---|
| | | | | | $20mc/cm^2$ | | | $10mc/cm^2$ | | |
| | | | $20mc/cm^2$ | $10mc/cm^2$ | S | $S_0$ | $S/S_0$ | S | $S_0$ | $S/S_0$ |
| A | 7400 | 0.1 | 28.0 | 42.0 | 264 | 72 | 3.69 | 176 | 72 | 2.5 |
| A | 7200 | 1.1 | 14.0 | 27.0 | 514 | 128 | 4.02 | 267 | 128 | 2.1 |
| A | 7400 | 2.2 | 10.0 | 16.0 | 740 | 220 | 3.36 | 462 | 220 | 2.1 |
| B | 6800 | 0.1 | 5.0 | 8.0 | 1360 | 800 | 1.7 | 850 | 800 | 1.1 |
| B | 6700 | 1.2 | 3.0 | 4.0 | 2230 | 970 | 2.3 | 1675 | 970 | 1.7 |
| B | 6700 | 2.2 | 2.0 | 3.0 | 3350 | 1650 | 2.0 | 2233 | 1650 | 1.4 |

The dramatic effect of increasing the water content of the methyl-isobutyl ketone developer from a trace amount to about 1% is shown by the data in Table I. Although no great differences in sensitivity were noted, the optimum water content for the higher energy exposure with respect to speed and sensitivity appear to be at the approximately 1% by volume water content range.

EXAMPLE 3

Example 3 illustrates the change in development rate of unexposed resist layers at different water contents. Silicon wafers were coated to a resist thickness of about 10,000 angstroms and a development temperature of 23° C was employed. A first wafer was developed using methyl-isobutyl ketone from a freshly opened bottle of J. T. Baker reagent. The original and final thicknesses of the resist layer were measured to be 10,200 and 8,100 angstroms respectively to give a calculated development rate of 700 angstroms per minute. The second wafer was developed using the same developer as the first which had been placed in a closed bottle with dry compressed air being bubbled through for 4.5 hours prior to its use in the developement. The original and final measured resist thicknesses were 10,100 and 8,060 respectively with a calculated development rate of 680 angstroms per minute. A third sample of methyl-isobutyl ketone from the freshly opened bottle was contacted with anhydrous calcium chloride for 4.5 hours and the supernatant methyl-isobutyl ketone was decanted off and used in a sealed bottle for the development period. The original and final measured resist thicknesses were 10,150 and 8,950 angstroms respectively to give a development rate of 400 angstroms per minute. A fourth sample of developer was prepared using a dried methyl-isobutyl ketone to which 0.5% water was added. The original and final resist thicknesses were measured to be 10,180 and 8,005 respectively to give a development rate of 725 angstroms per minute. A fifth wafer was developed using a developer having a total amount to about 1% by volume of water. The original and final resist thicknesses were measured to be 10,125 and 7,385 respectively. The development rate was determined to be 913 angstroms per minute. The above data illustrates the ability to adjust and control the developer rate by adjusting the water content of the methyl-isobutyl ketone. The molecular weight of the polymer employed was about 80,000 weight average molecular weight.

The foregoing has described a method of improving methyl-isobutyl ketone developers. Water, a non-solvent for the acrylate resist, surprisingly acts to speed the development process by increasing the solubility rate of the resist layer. This is particularly important in achieving practical process speeds when employing higher molecular weight, i.e. 400,000 and above, acrylate polymers at low exposure energies.

While the invention has been particularly shown and described with reference to preferred embodiments thereof, it will be understood by those skilled in the art that the foregoing and other changes in form and details may be made therein without departing from the spirit and scope of the invention.

We claim:

1. In the formation of patterned resist masks in which a layer of a methyl methacrylate polymer is coated on a substrate, exposed to radiation in a patternwise manner by a scanning electron beam having an energy of from about 3 to 50KV to provide a dosage level of from about 3 to 30 microcoulombs per square centimeter, and the exposed portions removed from the substrate using methyl-isobutyl ketone which dissolves the exposed portions of the layer at a faster rate than the unexposed portions to produce a relief image of resist on said substrate, the improvement which comprises adding water to said ketone such that the water content of said ketone is from about 0.5% to about 2.2% by volume so as to increase the development rate.

2. The process of claim 1 in which the water content of said ketone is determined by analysis and water added to bring the water content to from about 0.5 to about 2.2% by volume.

3. The process of claim 1 wherein any moisture is removed from said ketone by placing it over a drying agent and the water content brought to from about 0.5 to about 2.2% by volume of water by adding water to said dry ketone.

* * * * *